United States Patent
Kim et al.

(10) Patent No.: US 7,623,103 B2
(45) Date of Patent: Nov. 24, 2009

(54) ORGANIC LIGHT EMITTING DIODE DEVICE INCLUDING BRIGHTNESS COMPENSATION PLATE

(75) Inventors: Jung-Chul Kim, Seoul (KR); Jin Huh, Gumi-si (KR)

(73) Assignee: LG. Display Co., Ltd., Seoul (KR)

( * ) Notice: Subject to any disclaimer, the term of this patent is extended or adjusted under 35 U.S.C. 154(b) by 624 days.

(21) Appl. No.: 11/406,747

(22) Filed: Apr. 19, 2006

(65) Prior Publication Data

US 2006/0238462 A1    Oct. 26, 2006

(30) Foreign Application Priority Data

Apr. 22, 2005    (KR)    ............ 10-2005-0033393

(51) Int. Cl.
*G09G 3/32*    (2006.01)
(52) U.S. Cl. ....................................... 345/82
(58) Field of Classification Search ............ 345/76–83; 315/169.1–169.4; 257/40, 72, 88
See application file for complete search history.

(56) References Cited

U.S. PATENT DOCUMENTS

| | | | |
|---|---|---|---|
| 7,132,801 B2 * | 11/2006 | Park et al. ................. | 315/169.3 |
| 2004/0075395 A1 * | 4/2004 | Antoniadis et al. ........ | 315/169.1 |
| 2005/0140600 A1 * | 6/2005 | Kim et al. .................... | 345/76 |
| 2005/0200575 A1 * | 9/2005 | Kim et al. .................... | 345/76 |
| 2007/0182672 A1 * | 8/2007 | Hoppenbrouwers et al. ... | 345/76 |
| 2007/0236425 A1 * | 10/2007 | Furuie et al. ................. | 345/77 |

* cited by examiner

*Primary Examiner*—Richard Hjerpe
*Assistant Examiner*—Kimnhung Nguyen
(74) *Attorney, Agent, or Firm*—Brinks Hofer Gilson & Lione

(57) ABSTRACT

An organic light emitting diode device includes a substrate having first and second surfaces and a diode on the first surface of the substrate. The diode includes a first electrode, a second electrode facing the first electrode and an organic emitting layer between the first and second electrodes. Light is emitted from the diode toward the first and second surfaces of the substrate. A brightness compensation plate having a thickness that varies across a length of the plate is disposed on the second surface of the substrate for transmitting the light. The brightness compensation plate may improve a uniformity of a brightness of the organic light emitting diode device.

7 Claims, 5 Drawing Sheets

ORGANIC LIGHT EMITTING DIODE DEVICE INCLUDING BRIGHTNESS COMPENSATION PLATE

The present invention claims the benefit of the Korean Patent Application No. 2005-0033393 filed in Korea on Apr. 22, 2005, which is hereby incorporated by reference in its entirety.

TECHNICAL FIELD

The present disclosure relates to an organic light emitting diode (OLED) device, and more particularly, to an OLED including a brightness compensation plate that can compensate for a brightness deviation of the OLED.

BACKGROUND

Cathode ray tubes (CRTs) have been widely used for display devices, such as televisions and computer monitors. However, CRTs have the disadvantages of being large, heavy, and requiring a high drive voltage. As a result, flat panel displays (FPDs) that are smaller, lighter, and require less power have grown in popularity. Liquid crystal display (LCD) devices, plasma display panel (PDP) devices, field emission display (FED) devices, and light emitting diode (LED) devices are some of the types of FPDs that have been introduced in recent years.

The LED device may either be an inorganic LED device or an organic LED (OLED) device depending upon the source material used to excite carriers in the device. OLED devices have been particularly popular because they have bright displays, low drive voltages, and can produce natural color images incorporating the entire visible light range. Additionally, OLED devices have a preferred contrast ratio because they are self-luminescent. OLED devices can easily display moving images because they have a short response time of only several microseconds. Moreover, such devices are not limited to a restricted viewing angle as other LED devices are. OLED devices are stable at low temperatures. Furthermore, their driving circuits can be cheaply and easily fabricated because the circuits require only a low operating voltage, for example, about 5V to 15V DC (direct current). In addition, the process used to manufacture OLED devices is relatively simple.

FIG. 1 is a circuit diagram of an active matrix OLED (AM-OLED) device according to the related art.

In FIG. 1, one pixel region of an AM-OLED device is composed of a switching TFT T1, a driving TFT T2, a storage capacitor Cst, and an OLED 10. A gate electrode of the switching TFT T1 is connected to a gate line GL, the source electrode of the switching TFT T1 is connected to a data line DL, and the drain electrode of the switching TFT T1 is connected to a gate electrode of the driving TFT T2. The source electrode of the driving TFT T2 is connected to a power line VDD, and the drain electrode of the driving TFT T2 is connected to an anode of the OLED 10. A cathode of the OLED 10 is grounded. The storage capacitor Cst is connected to the gate and source electrodes of the driving TFT T2. When a scanning signal is applied to the gate electrode of the switching TFT T1 through the gate line GL and an image signal is applied to the drain electrode of the switching TFT T1 through the data line DL, the switching TFT T1 is turned ON. The image signal is stored in the storage capacitor Cst through the switching TFT T1. The image signal is also applied to the gate electrode of the driving TFT T2. As a result, a turn-on rate of the driving TFT T2 is determined. The current that passes through the channel of the driving TFT T2 in turn passes through the OLED 10 causing the OLED 10 to emit light in proportion to the current density. Since the current density is proportional to the turn-on rate of the driving TFT T2, the brightness of the light can be controlled by the image signal. The driving TFT T2 may be driven by charge stored in the storage capacitor Cst even when the switching TFT T1 is turned OFF. Accordingly, the current through the OLED 10 is persistent until a next image signal is applied. As a result, light is emitted from the OLED 10 until the next image signal is applied.

In FIG. 1, for example, the switching TFT T1 and the driving TFT T2 correspond to a positive channel metal oxide semiconductor (PMOS) TFT.

Meanwhile, since a driving current is applied to the OLED device through the power line, a pixel current always flows into the power line. Accordingly, the value of the driving current is increased as the number of pixels is increased.

For example, when the number of pixels is "n" along a row direction and the OLED device is driven as a full white, the driving current may refer to "$nI_{pixel}$." Therefore, a drop of the driving current may occur due to a line resistance of the power line VDD. Further, when a line resistance in each pixel refers to "$R_{pixel}$" and a driving current in each pixel refers to "$I_{pixel}$," the drop of the driving current in an Nth row of the row direction may refer to $[n(n+1)/2]R_{pixel}*I_{pixel}$. Therefore, since a gate voltage of each of the driving TFTs may be different from each other with respect to a same data voltage, a drop in the OLED current occurs. This drop of the driving current is increased with larger-sized OLEDs. Consequently, image quality degradation may be a problem.

In other words, the electric charge capacity charged in the storage capacitor Cst depends the gate voltage, so uniformity of the brightness may be depressed by changing the driving current applied to the OLED device. Accordingly, the drop capacity of the driving current is increased along the row direction, thereby reducing the brightness.

Moreover, problems such as brightness deviation due to the drop of the driving current may increase with larger and higher resolution OLED devices.

SUMMARY

Accordingly, the present disclosure is directed to an organic electroluminescent device and a fabricating method thereof that may substantially obviate one or more problems due to limitations and disadvantages of the related art.

An OLED device that may compensate for a brightness deviation due to a drop of a driving current applied to the OLED device is described herein. The OLED device may improve image quality.

The organic light emitting diode device may include a substrate having first and second surfaces and a diode on the first surface of the substrate. The diode includes a first electrode, a second electrode facing the first electrode, and an organic emitting layer between the first and second electrodes. Light is emitted from the diode toward the substrate. A brightness compensation plate having a thickness that varies along a length of the plate is disposed on the second surface of the substrate. The brightness compensation plate may improve the uniformity of the brightness of the organic light emitting diode device.

It is to be understood that both the foregoing general description and the following detailed description are exemplary and explanatory and are intended to provide further explanation of the invention as claimed.

DETAILED DESCRIPTION

Figure 1:
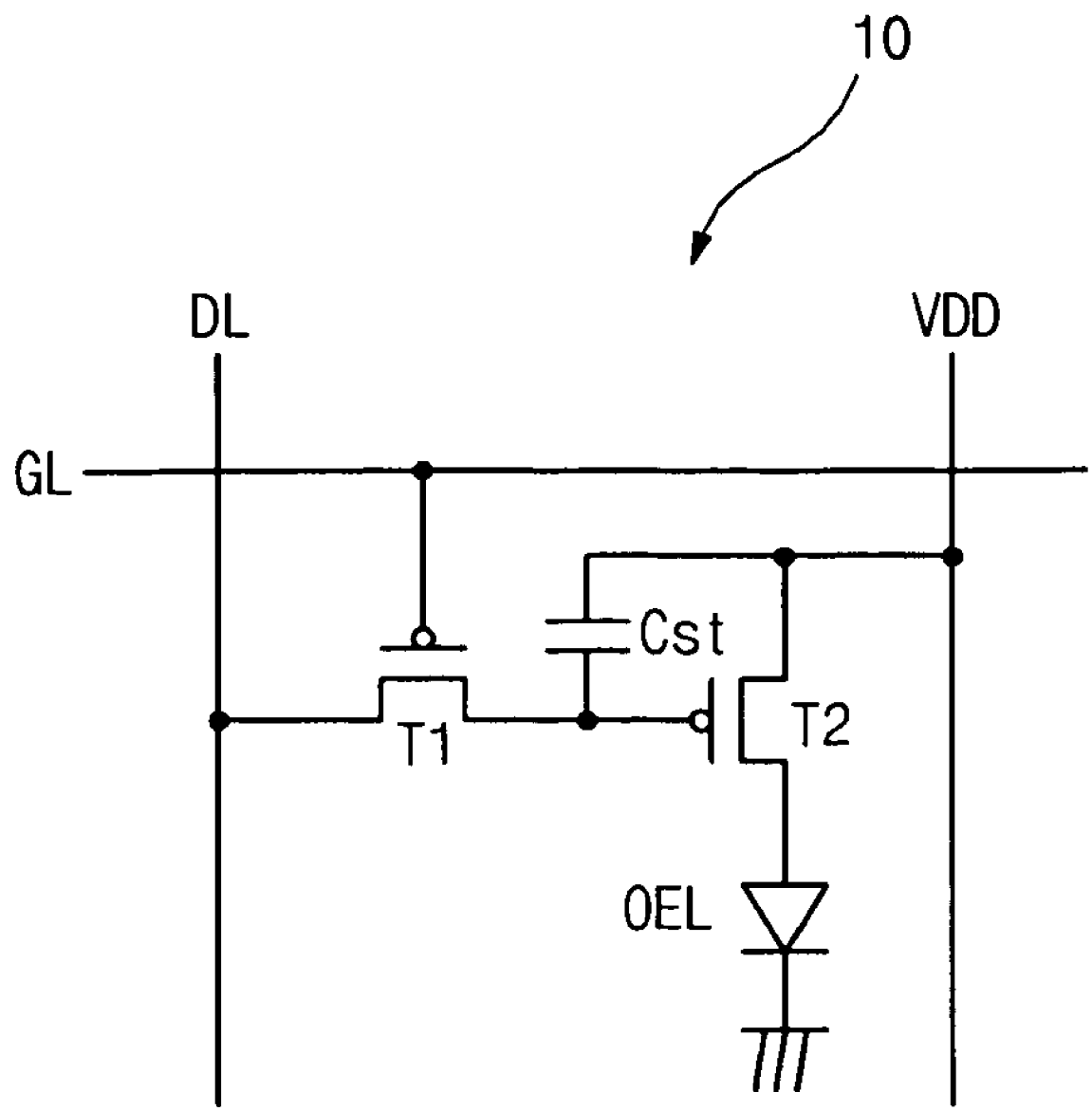
FIG. 1 is a circuit diagram of an active matrix OLED (AM-OLED) device according to the related art.
Figure 2:
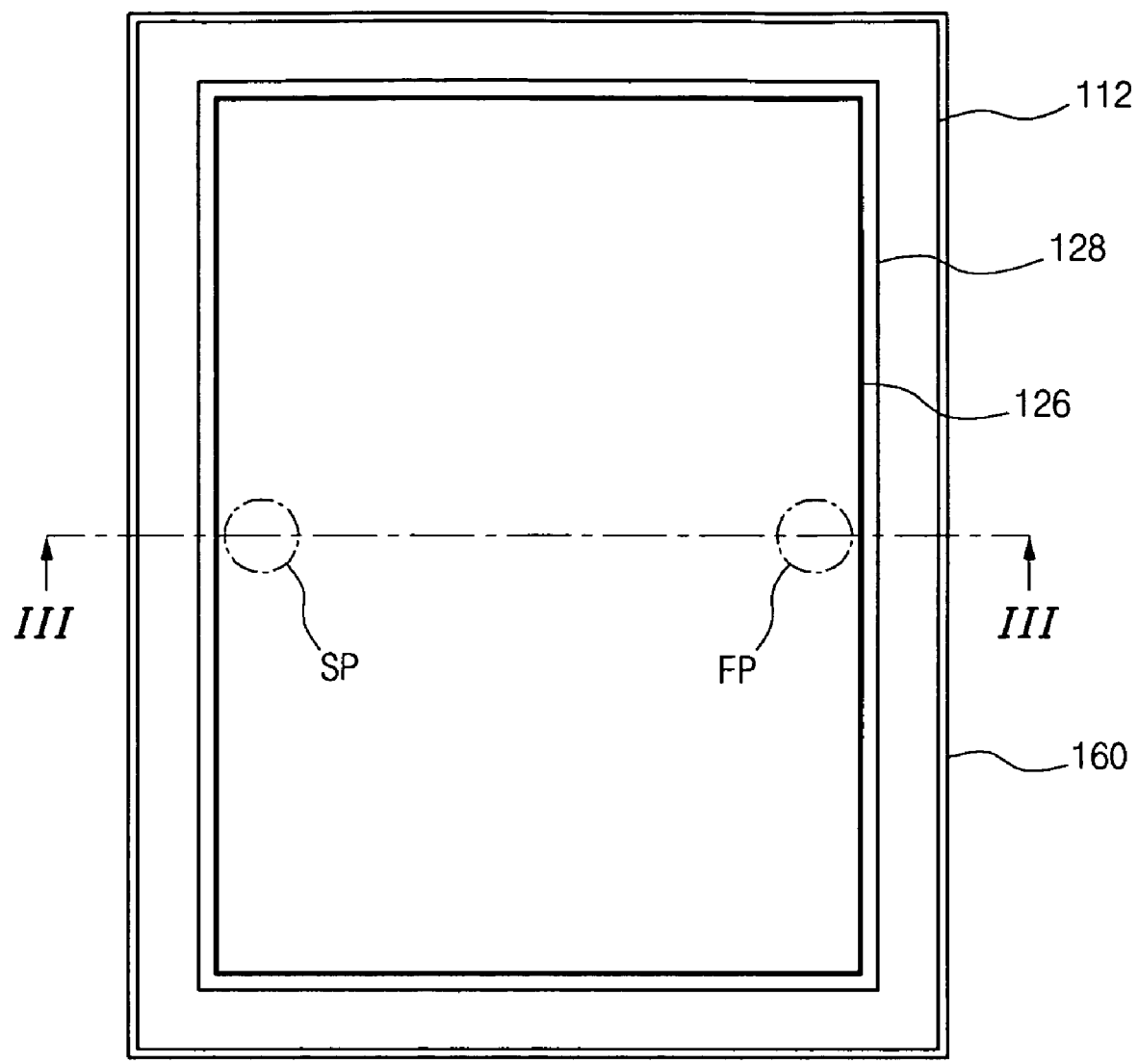
FIG. 2 is a schematic plan view of an OLED device according to one embodiment.
Figure 3:
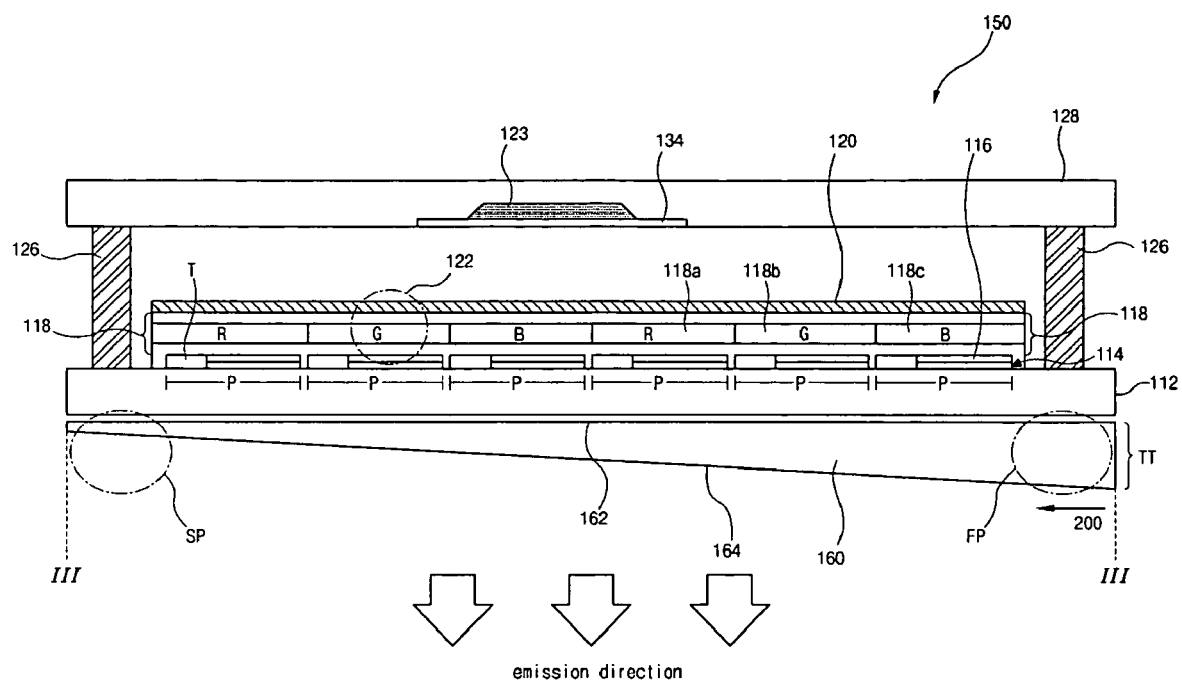
FIG. 3 is a schematic cross-sectional view taken along a line III-III of FIG. 2.
Figure 4:
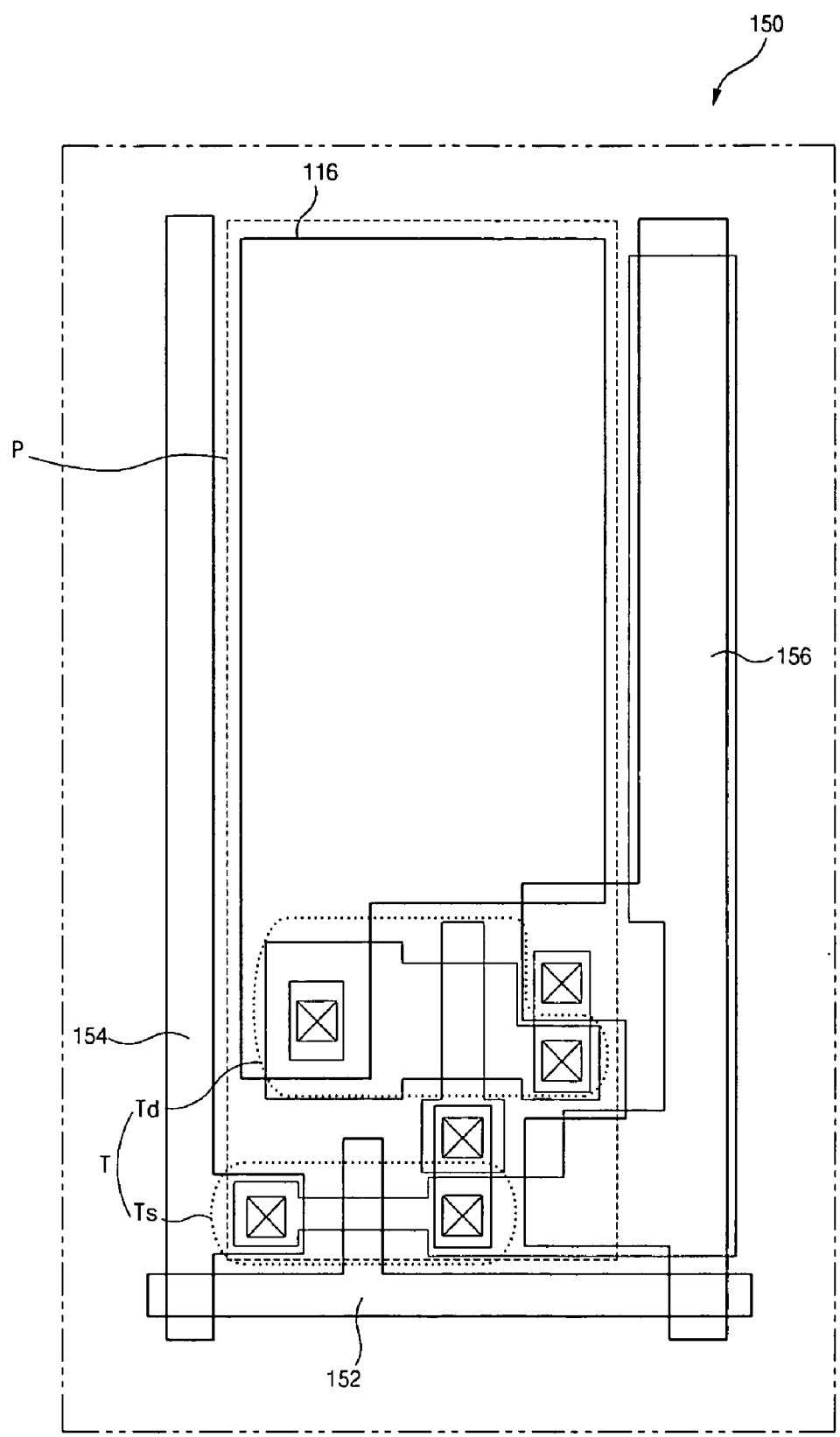
FIG. 4 is an expanded plan view of one pixel region of FIG. 2.
Figure 5:
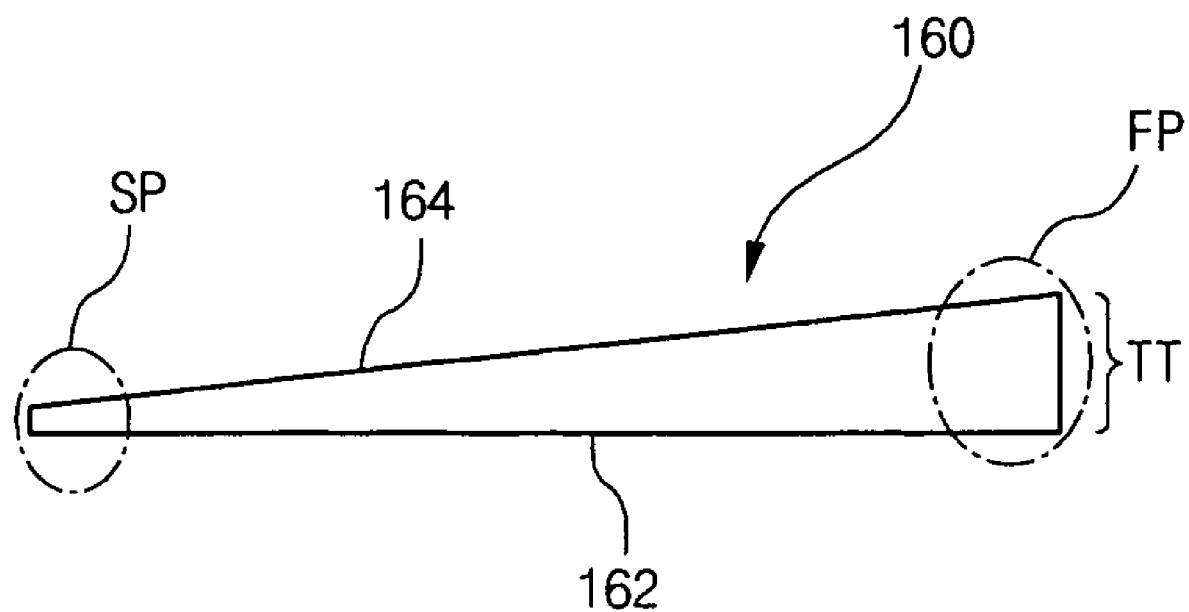
FIG. 5 is a schematic cross-sectional view of a brightness compensation plate for an OLED device according to one embodiment.

FIG. 2 is a schematic plan view of an OLED device according to one embodiment, FIG. 3 is a schematic cross-sectional view taken along a line III-III of FIG. 2, FIG. 4 is an expanded plan view of one pixel region of FIG. 2, and FIG. 5 is a schematic cross-sectional view of a brightness compensation plate for an OLED device according to one embodiment.

As shown in FIG. 2, a first substrate 112 and a second substrate 128 face each other and are spaced apart from each other. The first and second substrates 112 and 128 are attached to each other with a seal pattern 126 therebetween in an outermost edge.

Referring to FIG. 3, an array element 114 including a thin film transistor (TFT) T is formed on the first substrate 112. A first electrode 116, an organic electroluminescent layer 118 and a second electrode 120 are formed over the array element 114. The organic electroluminescent layer 118 displays colors of red, green and blue. That is, the organic emitting layer 118 includes red, green and blue emitting layers 118a, 118b and 118c that are repeatedly arranged in each pixel region P.

The first electrode 116, the organic electroluminescent layer 118 and the second electrode 120 form an OLED 122 and the array element 114 and the OLED 122 form an OLED device 150.

The OLED device 150 is encapsulated through attaching the first substrate 112 and the second substrate 128 including a moisture absorbent 123 with the seal pattern 126. Here, the moisture absorbent 123 is fixed with tape 134.

Further, a brightness compensation plate 160 is disposed on an outer surface of the first substrate 112. Specifically, the first substrate 112 adjacent to the brightness compensation plate 160 corresponds to a substrate through which light emitted from the OLED 122 is transmitted.

The thickness of the brightness compensation plate 160 may vary over a length of the plate 160 so as to improve the uniformity of the brightness of the light passing therethrough. Thus, the brightness of the OLED device 150 may be improved.

Referring to FIG. 4, the OLED device 150 further includes a driving element Td connected to the first electrode 116, a switching element Ts connected to the driving element Td, a gate line 152 and a data line 154 crossing the gate line 152, the gate and data lines 152 and 154 connected to the switching element Ts, and a power line 156 connected to the driving element Td.

The switching element Ts and the driving element Td form the TFT T including a gate electrode, a semiconductor layer, a source electrode and a drain electrode. Here, the TFT is a top gate type TFT, but the TFT may have other configurations.

In FIG. 3, the brightness compensation plate 160 is disposed in order to compensate for a brightness deviation due to a drop of a driving voltage applied to the power line 156 (of FIG. 4).

For example, when the light emitted from the diode includes a first brightness and a second brightness smaller than the first brightness and the thickness of the brightness compensation plate 160 includes a first thickness and a second thickness smaller than the first thickness, the first thickness transmits the light having the first brightness and the second thickness transmits the light having the second brightness.

Meanwhile, the brightness compensation plate 160 has a first surface 162 contacting an outer surface of the first substrate 112 and a second surface 164 facing the first surface 162.

For example, the OLED device 150 according to the embodiment may be a bottom type device such that the light is emitted from the diode toward the first substrate 112 or lower substrate. So, the brightness compensation plate 160 may be disposed on the outer surface of the first substrate 112.

For example, the brightness compensation plate 160 may include one of a glass, a polyethylene terephthalate (PET) and a polyethersulphone (PES). The transmittance of the brightness compensation plate 160 may be controlled by the thickness TT thereof selected from the mentioned materials. In other words, the brightness compensation plate 160 may compensate for the brightness deviation by its variable thickness TT.

Specifically, the transmittance of the OLED device 150 corresponding to a portion of the brightness compensation plate 160 having a large thickness may be smaller than the transmittance of the OLED device 150 corresponding to a portion of the brightness compensation plate 160 having a small thickness.

In other words, the thickness of the brightness compensation plate 160 may be gradually reduced in a direction 200 corresponding to a direction in which the transmittance of the OLED device is gradually increased so as to compensate for the brightness deviation.

Accordingly, the OLED device 150 as described herein may obtain a uniform brightness without changing a driving circuit and a driving current.

Meanwhile, the direction 200 may be determined with respect to a portion generating the drop of the driving current. However, as the case may be, the direction forming the slope may be changed including the other directions.

The brightness compensation plate 160 is gradually reduced in thickness from a right position to a left position so as to compensate a brightness deviation between the right position and the left position as shown in FIG. 5. In other words, the low brightness at the left position and the high brightness at the right position are compensated by the thickness differences of the brightness compensation plate 160.

For example, when a first brightness is 100% in a first position FP and a second brightness is 70% in a second position SP opposite to the first position FP regarding the OLED device 150, that is, the brightness is reduced from 100% to 70% (from the first position FP to the second position SP), the first portion FP of the brightness compensation plate 160 corresponding to the first position FP having the 100% brightness has a first thickness that reduces the first brightness to 70%. The second portion SP of the brightness compensation plate 160 corresponding to the second position SP having the 70% brightness has a second thickness that does not have an effect regarding the second brightness, as shown in FIGS. 2 and 3.

Accordingly, the brightness compensation plate 160 may compensate for the brightness deviation due to the drop of the driving current by controlling the thickness TT thereof, thereby making a uniform brightness with respect to the whole region.

The OLED device 150, including the brightness compensation plate 160, may compensate for the brightness deviation by the variable thickness of the brightness compensation plate 160, thereby controlling the transmittance of the OLED device 150. Accordingly, the brightness compensation plate 160 may be disposed on the outer surface of the substrate, where the light emitted from the OLED 122 is transmitted, of the OLED device 150.

It will be apparent to those skilled in the art that various modifications and variations can be made in the organic electroluminescent device of the present disclosure without departing from the spirit or scope of the invention. Thus, it is intended that the present disclosure cover the modifications and variations of this invention provided they come within the scope of the appended claims and their equivalents.

What is claimed is:

1. An organic light emitting diode device, comprising:
   a substrate having first and second surfaces;
   a diode on the first surface of the substrate, the diode including a first electrode, a second electrode facing the first electrode and an organic emitting layer between the first and second electrodes, wherein light is emitted from the diode toward the substrate; and
   a brightness compensation plate on the second surface of the substrate, wherein a thickness of the brightness compensation plate varies across a length of the plate, wherein the light emitted from the diode has a first brightness and a second brightness smaller than the first brightness, and the thickness of the brightness compensation plate includes a first thickness and a second thickness smaller than the first thickness, and wherein the first thickness transmits the light having the first brightness and the second thickness transmits the light having the second brightness.

2. The device according to claim 1, wherein the brightness compensation plate includes one of a glass, a polyethylene terephthalate (PET) and a polyethersulphone (PES).

3. The device according to claim 1, further comprising:
   a driving element connected to the first electrode;
   a switching element connected to the driving element;
   a gate line and a data line crossing the gate line, the gate and data lines connected to the switching element; and
   a power line connected to the driving element.

4. The device according to claim 3, wherein the switching element and the driving element each correspond to a thin film transistor including a gate electrode, a semiconductor layer, a source electrode and a drain electrode.

5. The device according to claim 3, wherein the brightness compensation plate compensates for a brightness deviation of the light emitted from the diode, the brightness deviation being due to a drop of a driving voltage applied to the power line.

6. The device according to claim 1, wherein the brightness compensation plate has a first surface contacting the second surface of the substrate and a second surface facing the first surface.

7. The device according to claim 1, wherein the organic emitting layer includes red, green and blue emitting layers that are repeatedly arranged in each pixel, defining a minimum unit for displaying an image.

* * * * *

UNITED STATES PATENT AND TRADEMARK OFFICE
CERTIFICATE OF CORRECTION

PATENT NO. : 7,623,103 B2
APPLICATION NO. : 11/406747
DATED : November 24, 2009
INVENTOR(S) : Kim et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 843 days.

Signed and Sealed this

Twenty-sixth Day of October, 2010

David J. Kappos
*Director of the United States Patent and Trademark Office*